Figure 1:
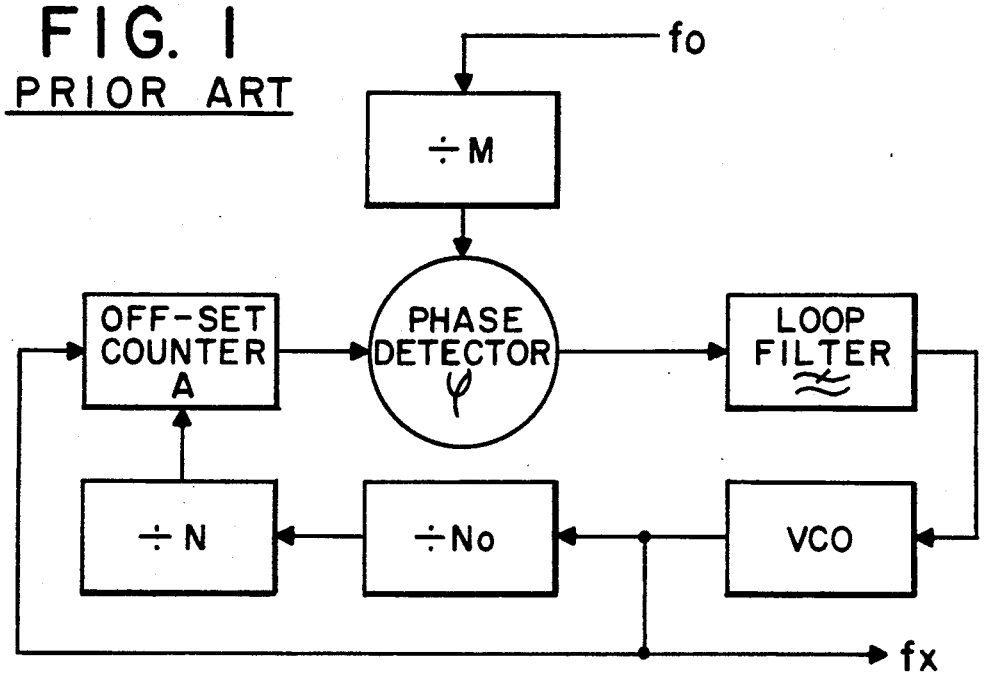

United States Patent [19]

Rapeli

[11] Patent Number: 5,079,520
[45] Date of Patent: Jan. 7, 1992

[54] INTERPOLATING PHASE-LOCKED LOOP FREQUENCY SYNTHESIZER

[75] Inventor: Juha Rapeli, Oulu, Finland

[73] Assignee: Nokia Mobile Phones Ltd., Salo, Finland

[21] Appl. No.: 638,130

[22] Filed: Jan. 7, 1991

[30] Foreign Application Priority Data

Jan. 18, 1990 [FI] Finland .................... 90-0303

[51] Int. Cl.⁵ .................................. H03L 7/18
[52] U.S. Cl. .......................... 331/100 A; 331/25
[58] Field of Search ........................ 331/1 A, 25

[56] References Cited

U.S. PATENT DOCUMENTS 4,611,230  9/1986  Nienaber .................... 331/25 X
4,868,524  9/1989  Costlow et al. ............. 331/25 X

*Primary Examiner*—Siegfried H. Grimm
*Attorney, Agent, or Firm*—Darby & Darby

[57] ABSTRACT

The invention concerns are interpolating frequency synthesizer based on digital phase locking, with which frequencies can be produced which lie between frequencies defined by integer divisors. Traditional frequency synthesizers employ frequency dividers in which the dividing ratio is an integer. The circuit of the invention comprises member (8, 9), in one of which the reference frequency ($f_o$) or the VCO frequency ($f_x$), or the frequency obtained from them by division, is multiplied with a coefficient L and in the other member the corresponding frequency is multiplied by $L + \Delta L$; and members (2, 7), in which the first pulses going to the phase detector (3) are lengthened by a time corresponding to a given integer number k1 of pulses formed in the number (8), and the other pulses are lengthened by a time corresponding to a given integer number k2 of pulses formed in the member (9).

6 Claims, 3 Drawing Sheets

INTERPOLATING PHASE-LOCKED LOOP FREQUENCY SYNTHESIZER

The present invention concerns an interpolating digital frequency synthesizer based on phase locking, with which such frequencies positioned between frequencies defined by integer divisors can be produced.

Conventional single-loop synthesizers utilize frequency dividers in which the division ratio N is an integer between unity and a large number. Frequency synthesizers are used e.g. in tuners, whereby it is possible with their aid to move from one channel frequency to another directly by stepping in jump fashion without passing through the intervening frequencies. A synthesizer commonly known in the art, based on a digital phase-locked loop (PLL), comprises, as shown in FIG. 1, a phase-locked loop (PLL) where the phase detector inputs are the basic frequency $f_o$ divided by a coefficient M and the frequency obtained by first dividing the output frequency $f_x$ of a voltage-controlled oscillator VCO in a pre-divider with divisor $N_o$ (typically $N_o=128$) and thereafter in a frequency divider with divisor N. Between the frequency divider and the phase detector is moreover provided an off-set counter A. The filtered output signal of the phase comparator controls the above-mentioned voltage-controlled oscillator VCO. When the loop is balanced, the VCO frequency is phase-locked to a basic frequency, and no signal goes from the phase detector to the loop filter. When the frequency synthesizer section is locked the pulse lengths of the frequencies arriving at the phase detector are equal, that is $$\frac{M}{f_o} = \frac{N \cdot N_o}{f_x} + \frac{A}{f_x} \qquad (1)$$

whence the VCO frequency is found to be $$f_x = \frac{f_o}{M} \cdot (NNO + A) \qquad (2)$$

The divided basic frequency $f_o/M$ determines the frequency of the pulses from the phase detector and the so-called frequency raster, this being the smallest programmable frequency interval. Typical numerical values, for instance for a 900 MHz PLL frequency synthesizer are as follows: $N_o=128$, $M=1024$, $N=614$, and a basic frequency (reference frequency) $f_x=12.8$ MHz. Then, $A=2$, the frequency will be $f_x=982.450$ MHz and the frequency raster is then 12.5 kHz. With different combinations of M, N, A, frequencies with spacing equal to the frequency raster can be produced.

The smallest frequency increment of the output frequency relative to the reference divider M is found by differentiating the expression (2), the result of which is $df_x = -f_o/M^2(N \cdot N_o + A)dM = f_x/M \, dM$ which has the numerical value of about 1 MHz in a 900 MHz radio telephone. It is noted that in the synthesizer known of prior art the drift of the output frequency, which is directly proportional to the drift of the reference frequency of, can only be compensated by analog control of the reference frequency, because adding a digital delay gate to the reference divider maintains nearly the same raster division $f_x/M$ as without delay. It is also possible to increase the value M, whereby the frequency raster would become smaller, but then also the pulse frequency arriving at the phase detector would be reduced, and this would lengthen the stabilizing time of the synthesis in the loop and would impede the filtering of the pulses in the loop filter.

It is known to use in measuring equipment a so-called fractional N synthesizer in which the partial fractions of the divider are so formed that the output frequency is divided by $N+1$ in every M'th cycle and the rest of time it is divided by N, whereby the output frequency will be $f_x = (N+1/M) f_o$. The output frequency can be varied in the fractional range of the reference frequency by changing the value of M.

As taught by the invention, by generating frequencies lying between integral frequencies and by thereafter producing a frequency raster which may be even as close as 100 Hz, the temperature and long-term drift of the reference frequency, harmful in existing in synthesizers, can be compensated. The technical requirements to be imposed on the circuit need not be raised, and the internal logic of the synthesizer can be utilized. It also becomes possible to select the reference frequency of the synthesizer with arbitrary freedom.

The objects of the invention are achieved in that the frequency synthesizer of the invention comprises members in one of which the reference signal frequency $f_o$ or the frequency obtained therefrom by dividing in a divider, or the output frequency $f_x$ of the oscillator VCO or the frequency obtained therefrom by dividing in a divider is multiplied by coefficient L, and in the other of which the corresponding frequency is multiplied by coefficient $L+\Delta L$, and members in one of which, each one separately, the pulses going to the phase detector are lengthened, each one separately, by a time corresponding to a given integral number k1 of cycle lengths of the pulses produced in said member, while in the other of which the pulses going to the phase detector are lengthened, each one separately, by a time corresponding to a given integer number k2 of cycle lengths of the pulses produced in said member.

As taught by the basic idea of the present invention, the reference frequency is multiplied by a coefficient L, whereby a pulse sequence of frequency $f_o \cdot L$ is obtained. The pulses of the pulse sequence divided from the reference frequency $f_o$ by divider M are lengthened by a time which corresponds to k1 of said pulses with frequency $f_o \cdot L$, whereby the pulse length of the pulse sequence going to the phase detector will be $$T = M/f_o + \frac{k_1}{L \cdot f_o}$$

Similarly, the reference frequency is multiplied with coefficient $L+\Delta L$, whereby a pulse sequence of frequency $f_o(L+\Delta L)$ is obtained, and the pulses divided from the VCO frequency coming to the phase detector are lengthened by a time corresponding to k2 pulses of said frequency, whereby the pulse length of the pulse sequence going to the phase detector from the direction of the VCO will be $$T = \frac{N_o \cdot N}{f_x} + \frac{A}{f_x} + \frac{k2}{(L+\Delta L)f_o}$$

When the phase detector is in equilibrium, the pulse lengths are equal and the equation obtained (cf. formula 1) can be solved for the VCO frequency $f_x$, which is found to be (cf. formula 2)

$$f_x = \frac{f_o(N \cdot N_o + A)}{M + \frac{k_1}{L} - \frac{k_2}{L + \Delta L}} \qquad (3)$$

Now the smallest effective change in the reference divider (in absolute units) is $M = k1/L - k1/(L + \Delta L)$, its smallest and at the same time equidistant value $M_{min}$ is obtained when $k1 = k2 = 1$.

As described in the foregoing, the fractions of the frequencies are produced by lengthening the whole pulses coming to the phase detector by partial fractions k1 and k2. Since then the pulse edges no longer coincide in time with the edges of the $f_o$ or VCO frequency pulses, the coefficients k1 and k2 have to be updated cyclically for each pulse. The pulses then become symmetrical and the VCO frequency remains an unmodulated point frequency. When synthesizing the frequencies corresponding to fractions of the divisor, the frequency of the pulses entering into the phase detector is no longer constant, $f_o/M$, but it varies in the range $f_o/M + 1$ to $f_o/M$, that is, little enough not to have any effect on the operation of the loop filter.

Figure 2:
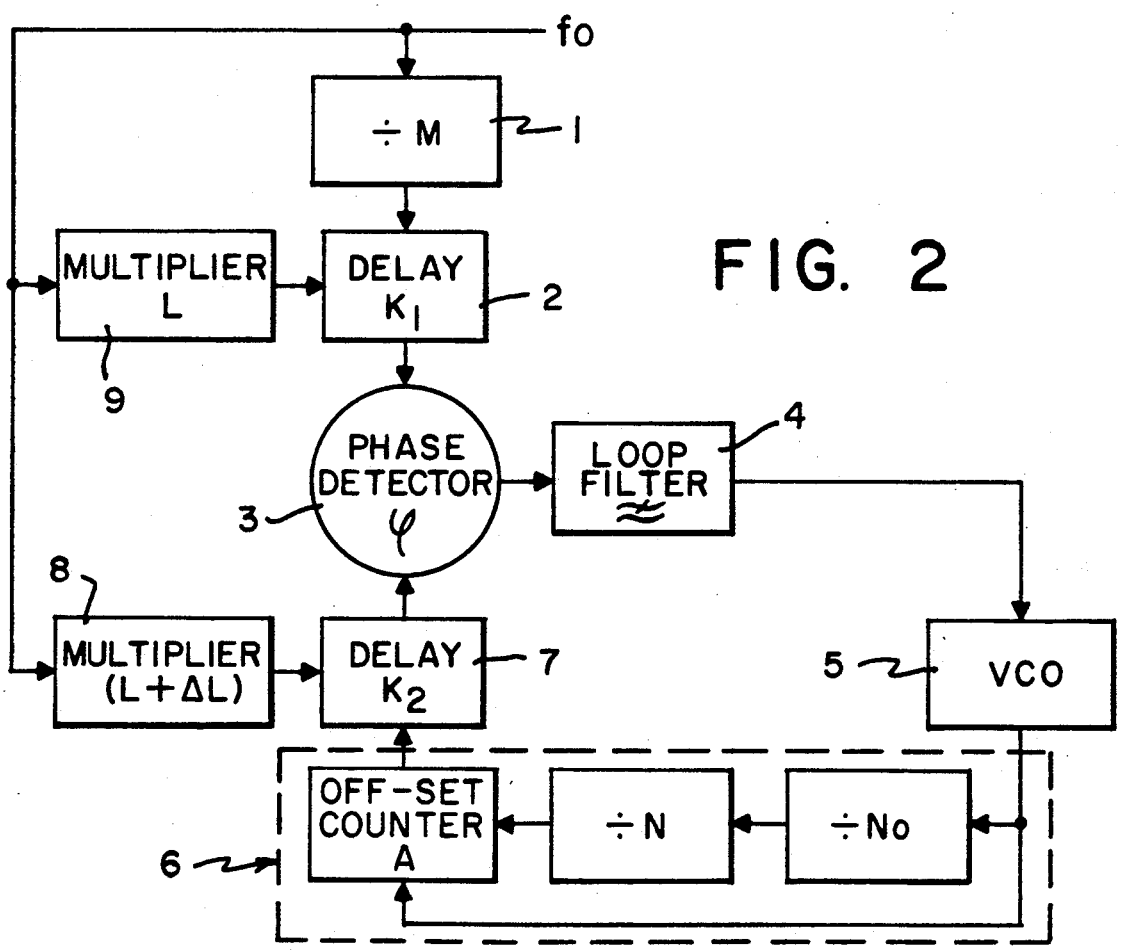
Figure 3:
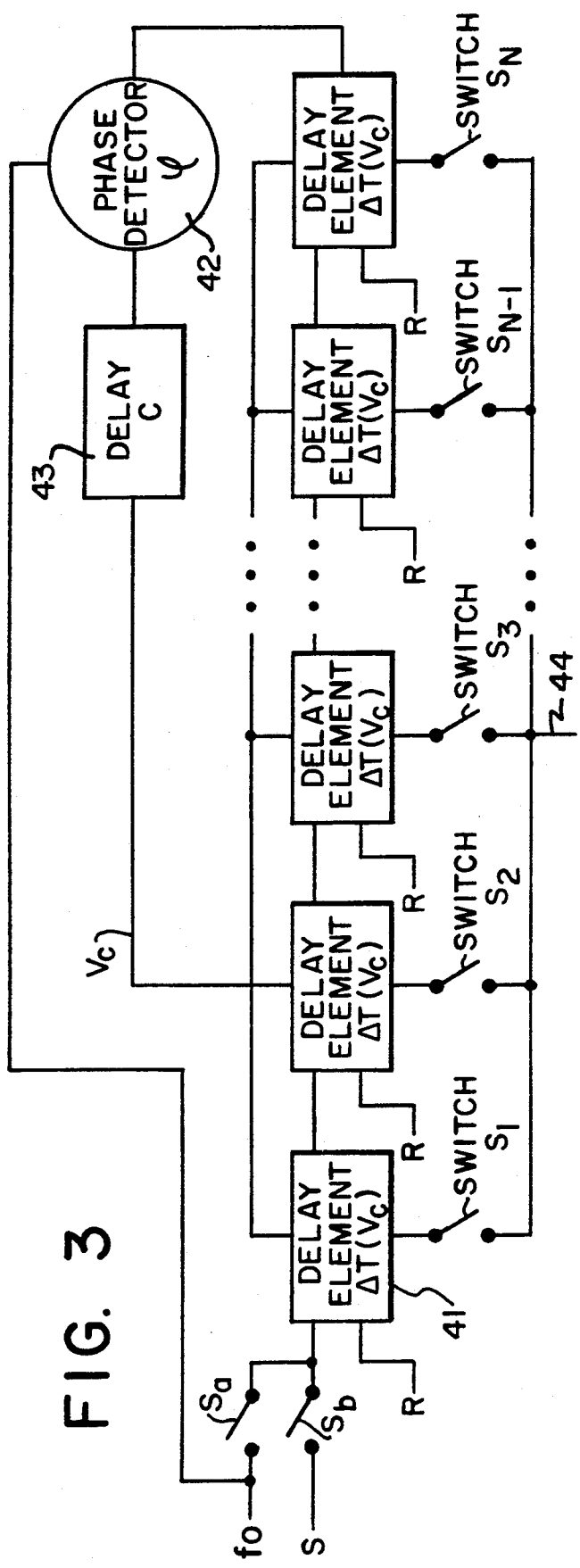
Figure 4:
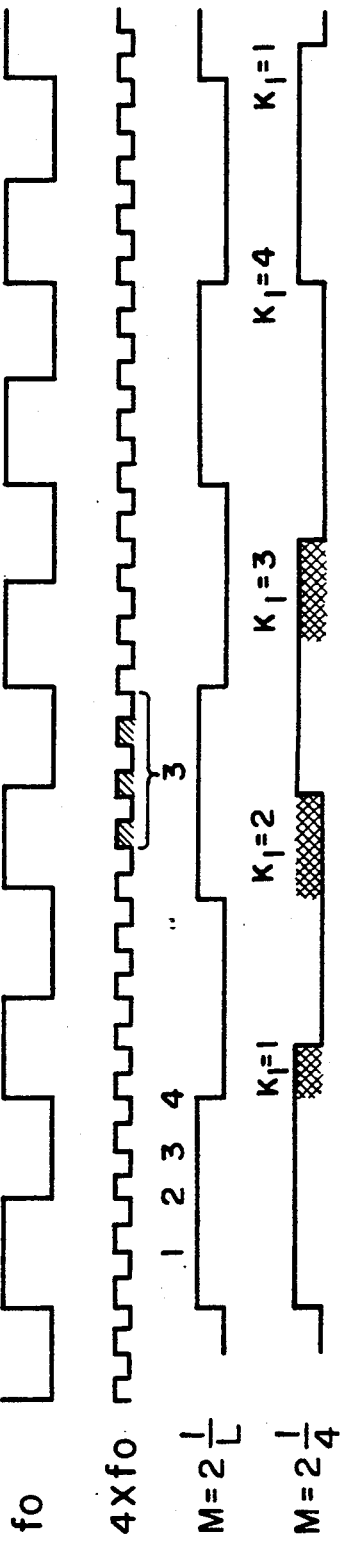
Figure 5:
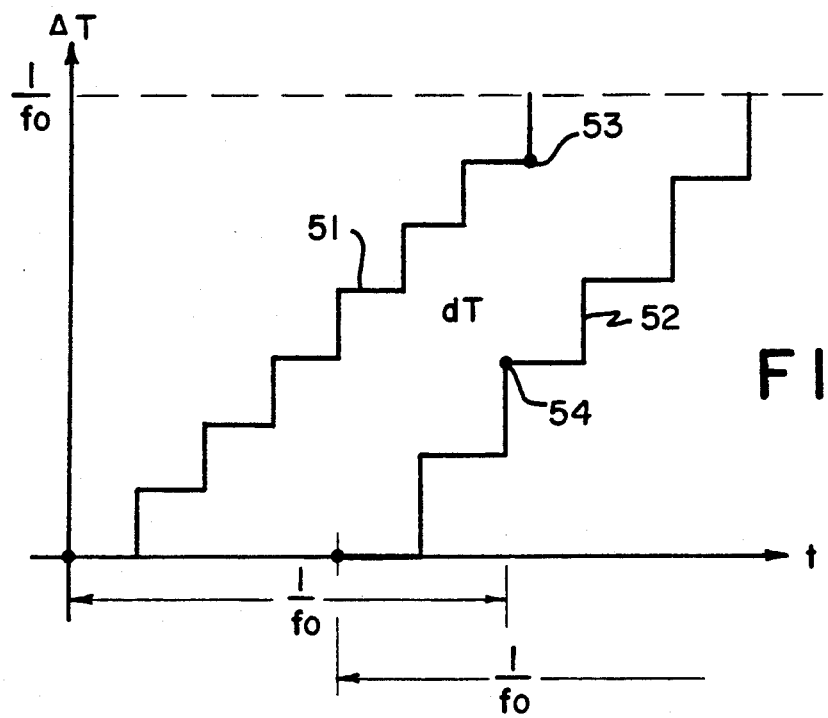
Figure 6:
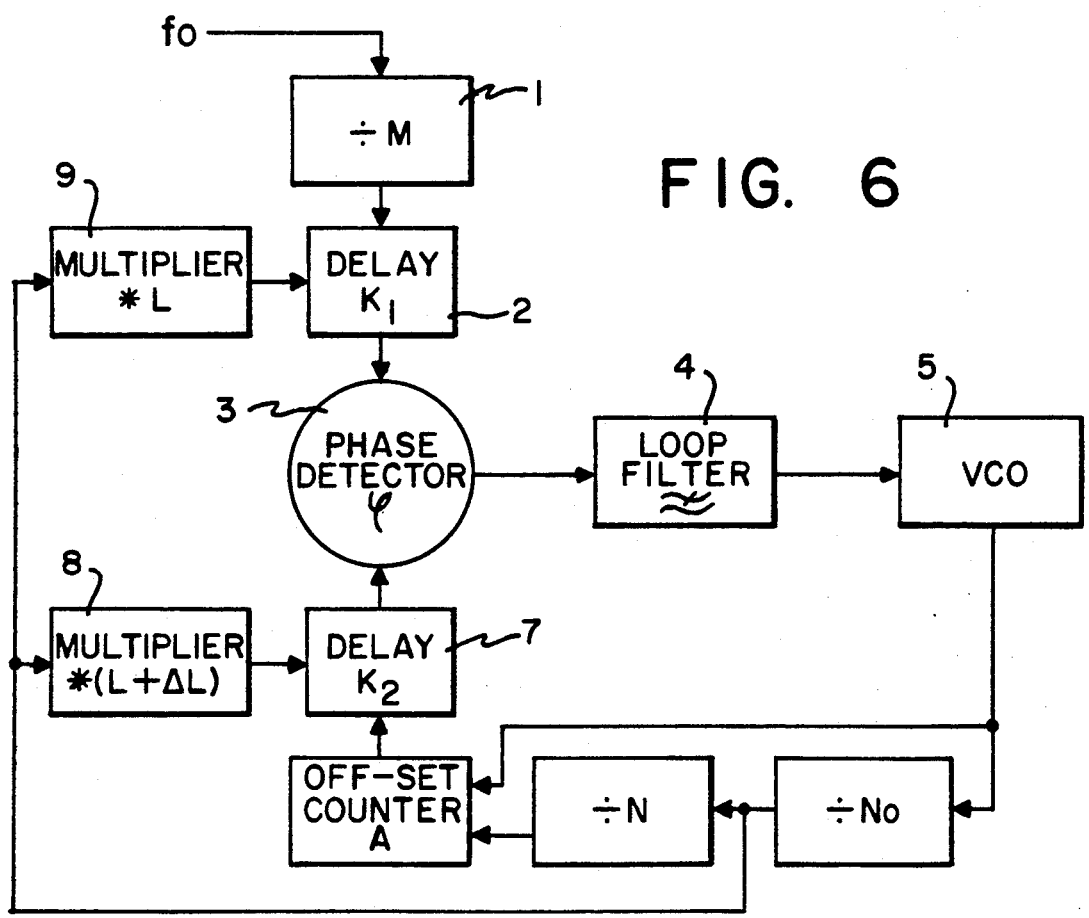

The invention is described more concretely below, referring to the accompanying figures, in which FIG. 1 presents the block diagram of a synthesizer of prior art interpolating FIG. 2 presents the block diagram of an interpolating synthesizer according to a preferred embodiment of the invention, FIG. 3 presents an embodiment of the delay chain, FIG. 4 illustrates the forming of fractions of an individual delay in the delay chain of unit delays, FIG. 5 presents the various pulse shapes, and FIG. 6 is an alternative embodiment.

The synthesizer of FIG. 1 is already described in the general section of the disclosure. The preferred embodiment of FIG. 2 deviates from the one presented above in that it includes blocks 2,9 and 7,8. In blocks 8 and 9, the reference frequency $f_o = 12.8$ MHz is multiplied by L and by $L + \Delta L$. In practice the multiplication is accomplished in that e.g. the speed of the delay chain of length L in FIG. 1 is adjusted to be such that the edge of the $f_o$ frequency pulse needs exactly the time $1/f_o$ to traverse the entire chain. The pulse delay consistent with the multiplied frequency is then obtained by selecting for the output of the delay register the output of the delay element representing the desired delay. The multiplication may also be carried out by forming within the circuit by VCO technique actual frequencies which on division by L and $L + \Delta L$ will form the reference frequency $f_o$, although this would be a poor design in view of circuit structures as well as power consumption. The delay chain of FIG. 3 consists of L or $L + \Delta L$ identical voltage-controlled delay elements 41, the phase of the pulse that has passed therethrough is compared in the phase detector 42 with that of the pulse that is fed in. The delay is adjusted with the delay member 43 to be such that the phases of the pulse that has passed through the chain and of that fed into it are the same or, if desired, inverted. Therefore, the delay of each delay element becomes set at the $1/L$ or $1/(L + \Delta L)$ fraction of the delay of the $f_o$ frequency pulse, and the desired multiple of this $1/L$ fraction delay is obtained by selecting for output 44, with switches S1 to $S_n$ the output of that delay element of which the ordinal number corresponds to the desired multiple. The delay element can be zeroed with signal R at any time, whereby the edge of the input signal S will proceed in the chain at pre-set speed. The operating mode is selected using switches Sa and Sb between calibration of the unit delay (switch Sb closed) and the desired pulse edge delay (switch Sa closed).

With the coefficients k1 and k2 of blocks 2 and 7, the fractional frequencies, that is the interpolated frequencies, are established. They are produced by delaying whole pulses by means of partial fractions k1 and k2.

In order to be able to lengthen each pulse in equal amount, and since then the edges of the pulses no longer coincide in time with the edges of the $f_o$ or VCO frequency pulses, the coefficient k1 and k2 must be updated cyclically for each pulse. The principle is apparent in FIG. 4. It is assumed in the figure, for simplicity and lucidity, that $M = 2$ and $L = 4$, and $k1 = 1$. It is furthermore assumed that the first pulse under consideration would start simultaneously with the leading edge of $f_o$. The consideration thus relates to the reference frequency branch of FIG. 2, but the principle is analogous also in the VCO branch. The topmost pulse sequence illustrates the reference frequency pulse sequence. The pulse sequence second from the top represents the frequency $4 \cdot f_o$ produced in the delay register in block 9. The next pulse sequence represents the reference frequency divided in the $M = 2$ divider. When this pulse sequence is carried to the phase detector, integer divisor frequencies are produced in the synthesizer. When now the generation of such frequencies is desired which lie between integer divisors, the first pulse is lengthened as shown in the figure, by a time which corresponding to k1 pulses produced in block 9. For the rising edge of the subsequent pulse to coincide with the rising edge of the pulse with reference frequency, the edge of the pulse from the divider M is offset to start later, by a time corresponding to the number of pulses produced in block 9 indicated by coefficient $k1 = 2$ and, similarly, the descending edge is delayed by a time corresponding to the number of pulses produced in block 9 indicated by the updated coefficient $k1 = 3$. The next leading edge is delayed by the time indicated by the updated coefficient $k1 = 4$. The descending edge following thereafter is delayed by the time indicated by coefficient $k1 = 1$, and the updating cycle of the coefficients is repeated. In the present case, the coefficients are a cyclical series 0, 1, 2, 3, 0, 1, 2, ... In the corresponding real instance, when $L = 63$ and $k1 = 7$, the cyclic updated coefficients are 7, 14, 21, 28, 35, 42, 49, 56, 63, 6, 13, 20 ...

It may be mentioned by way of an example that when $\Delta L = 1$, with the values mentioned on page 2 there is obtained $N_o = -128$, $N = 614$, $A = 2$, 1 reference frequency $f_o = 12.8$ MHz, and when L is selected to be $L = 63$ and $dM = _{min} = 248$ ppm and $df_{xmin}$ (frequency raster) $= 0.25$ kHz and thus, the highest frequency error is found to be 0.12 ppm. It is observed that with $L = 63$, frequency control with sufficiently accurate steps can be achieved for any existing radio telephone system. This is implementable well indeed technically, since H then the frequencies multiplied from $f_o$ are not more than half the VCO frequency. With appropriate frequency multiplying methods, L may be any integer, or also an integer $+\frac{1}{2}$, which enables a technologically optimal selection to be made.

FIG. 5 presents schematically the production of delays smaller than the single delay in the delay chain of FIG. 3, that is, of fractions of the single delay from the single delays of two delay chains having different frequencies. Here the stepped delay curves 51 and 52 represent the frequencies multiplied by coefficients L and L+ΔL, and the time difference of the delay curves in the x axis direction represents the difference of the starting times. The desired delay difference containing also fractions of the single delays is obtained, for instance in the present case, as the difference of the delays corresponding to point P1 on curve 51 and P2 on curve 52.

FIG. 6 is an embodiment alternative to that of FIG. 2. From the equilibrium equation of its phase detector the frequency $f_x$ is derived:

$$f_x = \frac{f_o}{M}\left(N_o N + A + \frac{k_2 N_o}{L + \Delta L} - \frac{k_1 N_o}{L}\right) \quad (4)$$

The smallest frequency change is $$df_{x,min} = \frac{f_o}{M} N_o \left(\frac{1}{L + \Delta L} - \frac{1}{L}\right) \quad (5)$$

that is, the frequency raster becomes divided into fractions similar to those in the form of FIG. 2, and in practice, even of the same size. However, the embodiment of FIG. 6 is inferior to the embodiment in the respect of FIG. 2 that in it the variable frequency $f_x$ is multiplied, for which reason it is less stable.

The circuit of the invention enables the drift of the reference frequency to be compensated and/or small frequency steps to be established utilizing the internal logic of the synthesizer. By the aid of multiplications and divisions, frequencies lying between integer. frequencies can be generated. The invention can be applied in all instances in which new reference frequencies are produced from a reference frequency with a synthesizer. An application of this kind is for instance the transmitter/receiver component of a radio telephone.

I claim:

1. A frequency synthesizer based on a digital phase-locked loop (PLL) wherein as frequencies of the input signals to a phase detector (3) serves a frequency divided from a reference pulse frequency ($f_o$) in a divider (1) with a number M and a frequency obtained from the pulse frequency ($f_x$) produced by a voltage-controlled oscillator VCO (5) by division in dividers (6), the output signal of the phase detector (3) filtered in a loop filter (4) controls the voltage-controlled oscillator VCO, characterized in that it comprises:

members (8,9), in one of which the reference signal frequency ($f_o$) or the frequency obtained therefrom by division in the divider (1), or the output frequency ($f_x$) of the oscillator VCO (5) or the frequency obtained therefrom by division in a divider (6), is multiplied with a coefficient L and in the other the corresponding frequency is multiplied with a coefficient L+ΔL, and members (2,7), in one (2) of said members the pulses of a first input signal, going to the phase detector (3), are each separately lengthened by a time corresponding to a given integer number k1 of pulse lengths of the pulses formed in the member (9), and in the other member (7) the pulses of a second input signal, going to the phase detector (3), are each separately lengthened by a time corresponding to a given integer number k2 of pulse lengths of the pulses formed in the member (8).

2. PLL frequency synthesizer according to claim 1, characterized in that the members (8,9) comprise a delay chain of length L or L+ΔL composed of consecutive delay register elements and the speed of which is locked so that the delay of one delay element (41) corresponds to the 1/L or 1/(L+ΔL) fraction of the period length of the pulse frequency coming to the member (8,9), the lengthening of the pulses going to the phase detector (3) in the manner indicated by integers k1 and k2 taking place with the aid of the edge of the pulse progressing in the delay chain.

3. PLL frequency synthesizer according to claim 2, characterized in that the progress through the delay chain of length L and L+ΔL of the edge of the pulse coming to the members (8,9) is synchronized to take place during the period of said incoming pulse and the lengthening in desired amount of the pulses coming to the phase detector takes place by directing to the phase detector (3) the output of that delay element of the respective delay chain of which the sequential number is indicated by the integer k1 and k2.

4. PLL frequency synthesizer according to claim 3, characterized in that each pulse coming to the phase detector (3) is lengthened in the members (2,9; 7,8) relative to the preceding pulse by updating the coefficients k1 and k2 for every pulse in that to the delay of the next pulse is added its delay by shifting in the delay chain the output k1 or the output k2 by the amount of the delay gate cyclically forward, and in case no delay is being used in the delay chains, on transgression of this point one whole clock pulse is added.

5. PLL frequency synthesizer according to any one of the preceding claims, characterized in that in the coefficient L+ΔL, ΔL has the value +1 or −1.

6. PLL frequency synthesizer according to claim 1, characterized in that the multiplication of frequencies in the members (8,9) takes place with the aid of controlled, phase-locked inverter chains.

* * * * *